United States Patent [19]
Yen

[11] 4,081,759
[45] Mar. 28, 1978

[54] OUTPUT SIGNAL CORRECTING CIRCUIT

[76] Inventor: Wai Lit Yen, 92 Pokfulam Rd., La Clare 7-B, Hong Kong

[21] Appl. No.: 699,648

[22] Filed: Jun. 24, 1976

[51] Int. Cl.² ............................................. H03F 1/34
[52] U.S. Cl. ..................................... 330/295; 330/84; 330/85; 330/149
[58] Field of Search ..................... 330/28, 84, 85, 149; 179/1 A, 1 F, 1 P

[56] References Cited

U.S. PATENT DOCUMENTS

| | | | |
|---|---|---|---|
| 3,031,627 | 4/1962 | Reichert et al. | 331/110 |
| 3,042,875 | 7/1962 | Higginbothan | 330/17 |
| 3,360,739 | 12/1967 | Cooke-Yarborough | 330/124 |
| 3,373,369 | 3/1968 | Cones | 330/23 |
| 3,379,988 | 4/1968 | Graham | 330/17 |
| 3,392,341 | 7/1968 | Burns | 330/13 |
| 3,399,354 | 8/1968 | Sodtke | 330/13 |
| 3,399,355 | 8/1968 | Ault | 330/15 |
| 3,418,590 | 12/1968 | Rongen et al. | 330/14 |
| 3,435,361 | 3/1969 | Van Doorn | 330/28 |
| 3,944,944 | 3/1976 | Ellenbecker | 330/149 |

FOREIGN PATENT DOCUMENTS

| | | | |
|---|---|---|---|
| 1,278,671 | 11/1961 | France | 330/149 |

*Primary Examiner*—James B. Mullins
*Attorney, Agent, or Firm*—Brumbaugh, Graves, Donohue & Raymond

[57] ABSTRACT

A circuit for correcting an AC output signal from an electronic device into closer correspondence with an AC input signal to the combination of the circuit and device comprises first and second amplifiers arranged to each receive the input signal. The first amplifier is also arranged to receive feedback of the output signal from the electronic device for providing a signal which is a function of the difference between the input and output signals. The combination of signals from the first and second amplifiers is provided to the electronic device for producing an output signal which corresponds closely to the input signal.

In a method of operating the circuit with an electronic device from which the output signal variably differs from the input signal, the amplitude of the output signal fed back into the first amplifier is adjusted to provide a null AC signal from the first amplifer at the output signal which deviates least from that desired. Then, when the input signal changes to produce an output signal which would deviate more than the minimum from that desired, the first amplifier produces a signal which varies inversely to the deviation to correct the output signal from the device.

3 Claims, 2 Drawing Figures

OUTPUT SIGNAL CORRECTING CIRCUIT

BACKGROUND OF THE INVENTION

The AC output signal from an electronic device which responds to an AC input signal is affected by the load on the output signal, the design constraints on the electronic device, and extraneous degradation such as noise or parasitic capacitances which may be picked up by or inherent in the apparatus which carries the output signal. Each of these factors degrades the amplitude and phase accuracy of the output signal relative to that desired from the input signal.

The accuracy with which the output signal corresponds to the input signal, however, is often important to the use of the electronic device. For this reason, for example, the distortion of the output signal relative to the input signal is a well-known way of gauging the quality of amplifiers.

One common use of amplifiers in which the accuracy of the output signal relative to the input signal is important is in high fidelity sound playback equipment. In these popular components, recorded or broadcast music (and voice) signals are amplified to drive a loudspeaker. The amplifier must accurately amplify the input signal so that the loudspeaker can accurately reproduce the recorded sound.

Design constraints of both cost and technical considerations such as gain, however, often require a trade or compromise between the cost of the amplifier or its gain and the accuracy of signal reproduction. Simiarly, design considerations of cost or space often make it difficult to fully shield the output side of the amplifier from noise and parasitic capacitances which degrade the output signal. These factors, however, arise substantially within the amplifier component and thus, within the design constraints, can be controlled by the manufacturer.

Many high fidelity amplifier components are sold separately from the loudspeaker loads to be driven by the amplifier. Inasmuch as all loudspeakers are not alike, the exact characteristics of the load to be coupled to the component cannot be determined in advance. In addition, the load characteristics of loudspeakers are not uniform (as is often assumed in the design of high fidelity amplifiers). Many speakers, for example, have a resonant frequency within the range of audio frequencies which they reproduce which significantly affects the electrical characteristics of the speaker load. In addition, many loudspeakers have frequency responsive crossover networks between an array of individual speakers within the loudspeaker which can further change the electrical characteristics of the loudspeaker load in response to the frequency of the output signal.

SUMMARY OF THE INVENTION

It is therefore an object of the invention to provide a circuit which corrects the output signal from an electronic device such as an amplifier into closer correspondence with a variable input signal than the electronic device itself can achieve.

It is a further object of the invention to provide a specific method of operating or presetting the circuit for operation with a particular electronic device.

To these ends and in accordance with the invention, an output signal correcting circuit is provided. The correcting circuit comprises first and second amplifiers which each receive a variable input signal such as an AC signal. The output signal from the electronic device is fed back to only the first one of the amplifiers as a further signal input to obtain a signal from the first amplifier which is a function of the difference between the input signal and the output signal.

The signals from the first and second amplifiers are combined for input to the electronic device. The electronic device responds to this combined signal with the output signal. The output signal then drives the load, as well as being fed back to the one amplifier.

It is important, of course, that the signals from the first and second amplifiers be accurate. These amplifiers, however, only have a function in the correcting circuit and are not, therefore, subject to other design constraints such as a gain. In addition, the load which they drive, the electronic device, is known so that its load characteristics can be fully considered by the designer and, still further, electronic devices are usually designed with a high input impedance so that changes in the signal to the electronic device will be minimally affected by the load characteristics of the device. It is therefore much easier to design inexpensive, highly accurate first and second amplifiers for the correcting circuit than it is to design a highly accurate electronic device such as a high gain amplifier for an unknown, variable loudspeaker load.

The preferred method of operating the correcting circuit accommodates nonuniformity of the load as well as nonuniformity of operation of the electronic device. In the amplifier-loudspeaker example, the nonuniformity of many loudspeaker loads has already been described. In addition, the response of many amplifiers is nonuniform over the entire range of input signal frequencies and gains at which the amplifier may be operated. The method therefore first determines the input signal frequency and amplitude, and the gain at which the amplifier (electronic device) most accurately responds to the signal from only the second correcting circuit amplifier which does not receive feedback from the electronic device. The amplitude of the feedback to the other correcting circuit amplifier (the first) is then adjusted until the AC signal from that amplifier is a null. The output signals from the correcting circuit amplifiers are then combined for input into the electronic device.

The operation of the correcting circuit after being preset according to the method can now be described. As long as the input signal and the electronic device remain at the most accurate conditions at which they were set in the method, no AC signal is produced by the first correcting circuit amplifier. The input signal is also provided to the other correcting circuit amplifier, however, and this amplifier (the second) does not receive feedback of the output signal and thus provides a signal to the electronic device for producing the output signal.

If, however, greater distortion occurs between the input and the output signals, both correcting circuit amplifiers produce signals and, because the signal from the first amplifier is a function of the difference between the input and output signals, the signal from the first correcting circuit amplifier varies inversely to the distortion in the output signal. Combining the signals from the correcting circuit amplifiers thus provides a signal to the electronic device which compensates for the distortion in the output signal.

For example, if the output signal is too small, the signal from the first correcting circuit amplifier which receives the feedback of the output signal is decreased to increase the combined signals to the electronic device and thereby increase the output signal. Too large an output signal and an output signal which is phase shifted from the input signal are correspondingly corrected by the correcting circuit. The operation of the correcting circuit is thus independent of the cause of the inaccuracy in the output signal and can correct inaccuracies caused internally within the electronic device, by noise or parasitic factors at the output end of the electronic device, or by variations in the load on the electronic device.

DESCRIPTION OF THE DRAWINGS

The preferred embodiment and method of operation will now be described with reference to drawings which are intended to illustrate but not to limit the invention and in which.

DESCRIPTION OF THE PREFERRED EMBODIMENT AND METHOD OF ITS OPERATION

The Preferred Embodiment

Figure 1:
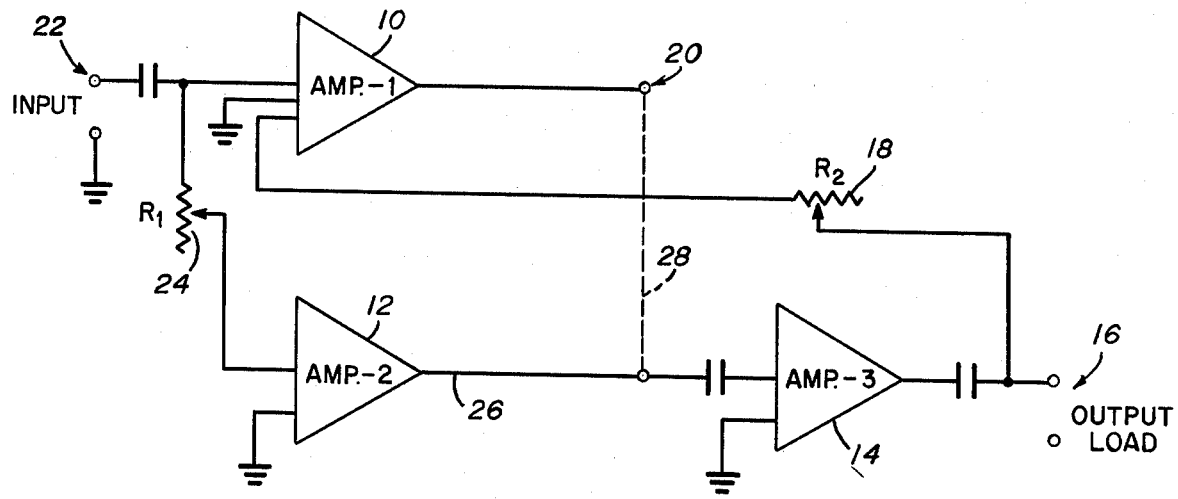
FIG. 1 is a generalized schematic of the preferred embodiment.

FIG. 1 shows the arrangement of the correcting circuit with a first amplifier 10 and a second amplifier 12 each illustrated generally. The electronic device 14 which provides the output signal at 16 to be corrected by the correcting circuit is also generally illustrated as a third amplifier. This electronic device 14 may be, for example, one of the known types of amplifiers used in commercially available high fidelity sound reproduction components with its feedback stage removed. The output load (indicated, but not shown) which is connected to the output signal at terminal 16 then may be a loudspeaker. In other embodiments, however, the electronic device 14 may be another type of electronic device which produces an AC output signal in response to an AC signal input.

The output signal at 16 is a fed back along a path including variable resistor 18 to an input terminal of the first correcting circuit amplifier 10. The first amplifier 10 then provides a signal output to terminal 20 which is a function of the difference between the input signal applied at terminal 22 and the feedback (output) signal.

The input signal at terminal 22 is also provided to the second correcting circuit amplifier 12 along a path including a variable resistor 24. The signal from the second amplifier 12 is provided to the third amplifier 12 along path 26. As later described with reference to the preferred method of operating the circuit, the signal from amplifier 10 is combined with the signal from amplifier 12 via a path 28 to be also provided as part of the signal input to the amplifier 14. The path 28 is shown in dashed lines to indicate that it is open circuited for the initial steps of the method during which the correcting circuit is preset for operation with a particular electronic device 14 and then closed to the path 26 for operation of the correcting circuit.

Figure 2:
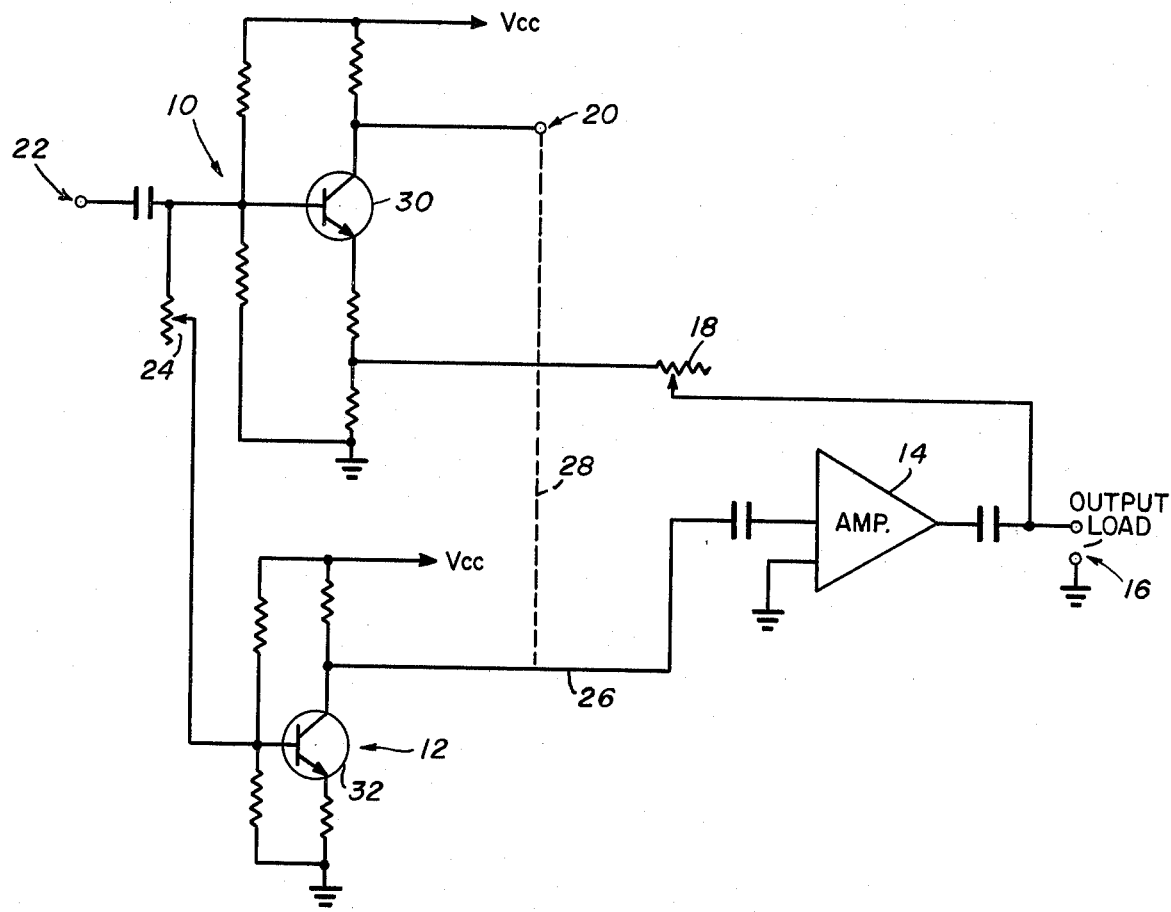
FIG. 2 is a more specific schematic of the preferred embodiment.

FIG. 2 shows the preferred embodiment of FIG. 1 with the first and second correcting circuit amplifiers 10 and 12 illustrated in greater detail. As shown in FIG. 2, the first and second amplifiers are each single transistor amplifiers in which the transistors 30, 32 may be of a type designated 2SC945 which is commercially available from N.E.C. The base of each transistor is connected to receive the input signal from terminal 22 and the collector of each transistor is, in operation, commonly connected via paths 26 and 28 to provide the combined signal input to amplifier 14.

The resistor 18 may then have a range of resistances around 10 times the output impedance of the electronic device 14 or about 100 to 300 ohms for many commercially available amplifier components which preferably embody the electronic device 14. The resistor 24 should have a range of relatively high values; for example, a range about 500K ohms. Selecting the values of the other resistors, capacitors, and bias potentials indicated in FIG. 2 are design choices well within the capabilities of those in the art.

The Method

In order to make sure that the correcting circuit does not introduce additional inaccuracy into the output signal at 16, it is preferred to preset the correcting circuit to have no affect on the output signal when the output signal is most accurately related to the input signal at 22. The method, therefore, contemplates first determining the conditions of, for example, input signal frequency, and third amplifier gain and output load at which the output signal at 16 most accurately corresponds to the input signal. This condition is often achieved at a particular frequency input signal and full gain in the amplifier. The most accurate condition, however, can be established with a variety of known instruments and techniques such as, for example, an oscilliscope.

The signal which produces the least distortion in the output signal at 16 is then provided at 22 and resistor 24 adjusted so that the signal from amplifier 12 which is input to the electronic device 14 along path 26 is of an appropriate amplitude for providing the least distorted output signal at 16. Path 28 is open circuited during this operation so that only the signal on path 26 from amplifier 12 is provided to the electronic device 14.

The feedback signal to amplifier 10 is then adjusted by adjusting resistor 18 until the AC signal at now open-circuited terminal 20 from amplifier 10 is a null. The correcting circuit is then preset in such a way that when the output signal at 16 is least distorted relative to the input signal at 22, the correcting circuit will have no affect on the output signal. The correcting circuit thus cannot introduce additional distortion into the output signal.

Path 28 is then closed to path 26 to carry the signal from amplifier 10 to line 26 for input to the electronic device 14 and the input signal at 22 no longer has to be held at the signal which produced the least distortion in the output signal. The correcting circuit is thus preset to leave the minimum distortion in the output signal unchanged, but, as now described, arranged to correct greater distortion in the output signal.

Operation

If the input signal at 22 continues at the frequency and amplitude which produce the least distortion in the output signal at 16, the AC signal output from amplifier 10 continues to be a null. The input signal, as operated on by resistor 24 and amplifier 12, however, is provided via path 26 to the electronic device 14 to produce an AC output signal at 16 which most accurately corresponds to the input signal. If, however, the input signal at 22 changes, both amplifiers 10 and 12 produce signals which are combined as inputs to electronic device 14 to produce the output signal at 16.

The electronic device 14 has been described as a high fidelity sound signal amplifier. Such amplifiers are linear. The amplifiers shown at 10 and 12 in FIG. 2 are also linear. An increase in the amplitude of the input signal at 22 therefore produces a signal on path 26 which is increased by the gain of amplifier 12 and an output signal at 16 which is increased by the gain of amplifier 14. Assuming an absolute gain of more than one for these amplifiers, the output signal at 16 is then increased in amplitude relative to the input signal. If the increase in the output signal is proportional to that of the input signal by the gain of amplifiers 12 and 14, the AC signal output from amplifier 10 remains a null. If, however, the output signal at 16 is too large relative to the input signal as by distortion in amplifier 14, a change in the output load (not shown), or a change in noise pickup at the output end of amplifier 14, the feedback signal through resistor 18 to amplifier 10 no longer nulls the input signal to amplifier 10 and the AC output signal from the amplifier 10 decreases. The decreasing signal from amplifier 10 is combined with the signal output from amplifier 12 on path 26 to decrease the signal input to the amplifier 14 and thereby decrease the output signal at 16 proportionally to its distortion. Conversely, if the distortion of the AC output signal diminishes the AC output signal relative to the AC input signal, the feedback of the output signal through resistor 18 to amplifier 10 decreases to increase the signal from amplifier 10 and thereby increase the signal input to amplifier 14 to increase the output signal.

As thus described, the correcting circuit corrects the amplitude of the output signal relative to the input signal to a level which approaches that of the least amplitude distortion in the output signal for which the correcting circuit was preset by the method described. A similar operation occurs for phase aberations in the output signal. If the output signal lags the input signal in phase, the input signal will produce a signal from amplifier 10 ahead of the feedback signal to thereby advance the phase of the signal on path 26 to amplifier 14 and thereby advance the phase of the output signal at 16. Conversely, if the phase of the output signal leads the input signal, the output signal from amplifier 10 will lag the input signal and correspondingly adjust the output signal.

From the described operation of the correcting circuit, it will be appreciated that its operation can be adapted to pulse signal (square wave) devices or nonlinear amplifiers and that the AC signals described throughout are signals of variable amplitude but not necessarily reversing absolute polarity. The linear, high fidelity sound signal amplifier 14 and the linear amplifiers 10 and 12 are thus merely the preferred embodiment of the invention contemplated as within the scope of the following claims.

I claim:

1. A circuit for correcting the AC output signal from an electronic device which responds to a variable input signal, such as an amplifier, the circuit comprising:
    first and second amplifiers with the input of the first directly receiving the AC portion of the input signal;
    a variable input resistance with one end attached to the input of the first amplifier and the other end attached to the input of the second amplifier;
    means for combining the output signals from the first and second amplifiers and for providing the combined AC signals to the electronic device; and
    variable resistance feedback means for providing a selected portion of the AC output signal from the electronic device to the first amplifier only, said feedback means changing the signal from the first amplifier as a function of the difference between the input signal and the output signal, whereby the output signal from the electronic device in response to the combined signals from the first and second amplifiers more closely corresponds to the input signal than would the output signal from the electronic device if the electronic device received the input signal directly.

2. A circuit as set forth in claim 1 wherein the first and second amplifiers are linear amplifiers; the function by which the feedback means changes the signal output from the one amplifier is linear; and the electronic device is a third linear amplifier, whereby a change in the output signal which does not correspond to a change in the input signal produces an inversely proportional change in the signal to the electronic device for correspondingly correcting the output signal from the electronic device.

3. A circuit for correcting the AC output signal from a third linear amplifier relative to a variable input signal, the circuit comprising:
    first and second linear, single transistor amplifiers having the base of the transistor of the first amplifier arranged for directly receiving the AC portion of the input signal;
    a variable input resistance for connecting the bases of the two transistors of the first and second amplifiers;
    means commonly connecting one of the collector and emitter of each amplifier transistor for providing a combined AC signal from the first and second amplifiers to the third amplifier and; and
    variable resistance feedback means providing a selected portion of the AC output signal to one of the base and emitter of the transistor of only the first amplifier for changing the signal from the first amplifier linearly with the difference between the input and output signals.

* * * * *